United States Patent [19]
Schwalke et al.

[11] Patent Number: 5,726,094
[45] Date of Patent: Mar. 10, 1998

[54] PROCESS FOR PRODUCING A DIFFUSION REGION ADJACENT TO A RECESS IN A SUBSTRATE

[75] Inventors: Udo Schwalke, Heldenstein; Michael Sebald, Hessdorf; Ulrich Scheler, München, all of Germany

[73] Assignee: Siemens Aktiengesellschaft, Munich, Germany

[21] Appl. No.: 693,262

[22] PCT Filed: Feb. 1, 1995

[86] PCT No.: PCT/DE95/00123

§ 371 Date: Aug. 14, 1996

§ 102(e) Date: Aug. 14, 1996

[87] PCT Pub. No.: WO95/22173

PCT Pub. Date: Aug. 17, 1995

[30] Foreign Application Priority Data

Feb. 15, 1994 [DE] Germany .................. 44 04 757.6

[51] Int. Cl.$^6$ ................................................. H01L 21/225
[52] U.S. Cl. .................... 438/561; 438/164; 438/551
[58] Field of Search ................... 438/164, 551, 438/561, 563, 564

[56] References Cited

U.S. PATENT DOCUMENTS

| | | | |
|---|---|---|---|
| 4,013,484 | 3/1977 | Boleky et al. | 438/227 |
| 4,534,824 | 8/1985 | Chen | 257/499 |
| 4,564,583 | 1/1986 | Maeguchi | 438/291 |

(List continued on next page.)

FOREIGN PATENT DOCUMENTS

| | | |
|---|---|---|
| 0 073 942 | 3/1983 | European Pat. Off. . |
| 0 259 605 | 3/1988 | European Pat. Off. . |
| 0 430 168 | 6/1991 | European Pat. Off. . |
| 0 445 471 | 9/1991 | European Pat. Off. . |
| 27 18 894 | 11/1977 | Germany . |

OTHER PUBLICATIONS

H. Ahne et al., "CARL Resist: A Technology for Optical Quarter Micron Resolution and Below", Siemens Review—R & D Special—Spring 1991, pp. 23-27.

M. Sebald ey al., "Chemical Amplification of Resist Lines (CARL) A Novel Sub-Halfmicron Bilayer Resist Technique For NUV and Deep UV Lithography", SPIE vol. 1262 Advances in Resist Technology and Processing VII (1990), pp. 528-537.

(List continued on next page.)

Primary Examiner—Chandra Chaudhari
Attorney, Agent, or Firm—Hill, Steadman & Simpson

[57] ABSTRACT

A method for producing a diffusion region adjacent to a recess in a substrate, with which structured diffusion regions can be produced within a recess is provided. The method is suitable, in particular, for producing diffusion regions of different conductivity type, which are arranged adjacent to one and the same recess or different recesses. The method for producing at least one diffusion region adjacent to a recess in a substrate, has the steps of: etching at least one recess which extends essentially perpendicularly to a surface of the substrate into the substrate, the substrate having silicon at least on the surface;

applying a diffusion barrier layer over the entire surface; structuring the diffusion barrier layer using a multi-layer photoresist system having at least two layers; for structuring the diffusion barrier layer, applying a bottom resist layer which is made opaque by baking out; applying a top resist layer which is illuminated and developed; etching the bottom resist layer in an anisotropic dry etching process using the developed top resist layer as a mask; removing the bottom resist layer and the top resist layer after the diffusion barrier layer has been structured;

depositing a doped layer which is suitable as a diffusion source over the entire surface; and forming the diffusion region by diffusion out from the doped layer, the structured diffusion barrier layer under the doped layer acting as a mask.

9 Claims, 7 Drawing Sheets

U.S. PATENT DOCUMENTS

| | | | |
|---|---|---|---|
| 4,666,557 | 5/1987 | Collins et al. | 438/561 |
| 4,728,619 | 3/1988 | Pfiester et al. | 438/528 |
| 4,977,104 | 12/1990 | Sawada et al. | 438/561 |
| 5,308,790 | 5/1994 | Allman et al. | 438/561 |

OTHER PUBLICATIONS

N. Yasuhara et al., "SOI Device Structures Implementing 650 V High Voltage Output Devices On VLSIs", IEDM 1991, pp. 141–144.

A. Nakagawa et al., "New 500V Output Device Structures For Thin Silicon Layer on Silicon Dioxide Film", Proceedings of 1990 International Symposium on Power Semiconductor Devices & ICs. Tokyo, pp. 97–101.

IBM Technical Disclosure Bulletin, "Sidewall Channel–Stop Doping For Deep Trench Isolation of FET Devices", vol. 27, No. 10A, Mar. 1985, pp. 5501–5504.

IBM Technical Disclosure Bulletin, "Schottky Diode Butting Against Recessed Oxide Isolation", vol. 27, No. 7B, Dec. 1984, pp. 4503–4508.

Y. Ohota et al. "Dielectrically Isolated Intelligent Power Switch", IEEE 1987, Custom Integrated Circuits Conference, pp. 443–446.

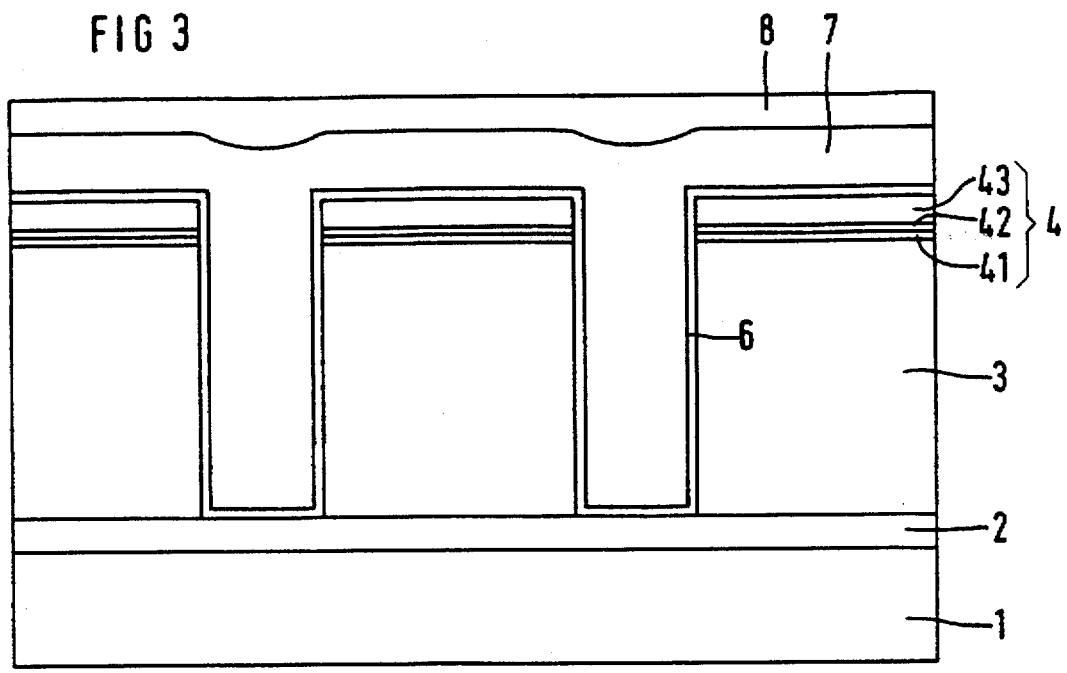
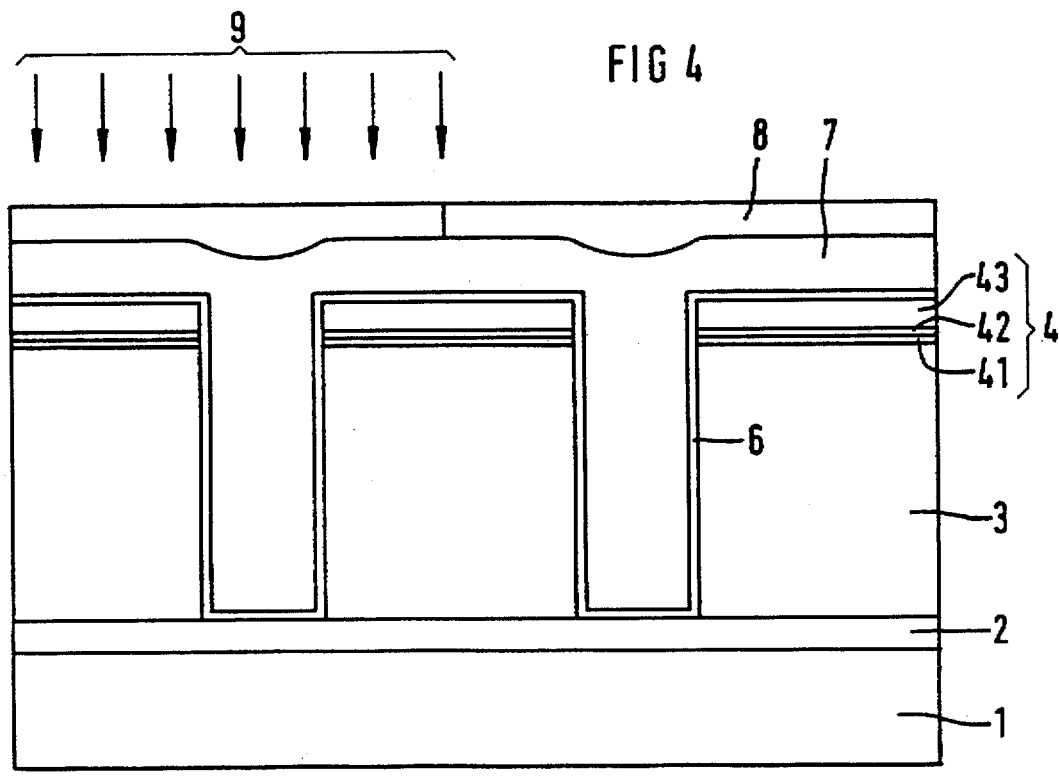

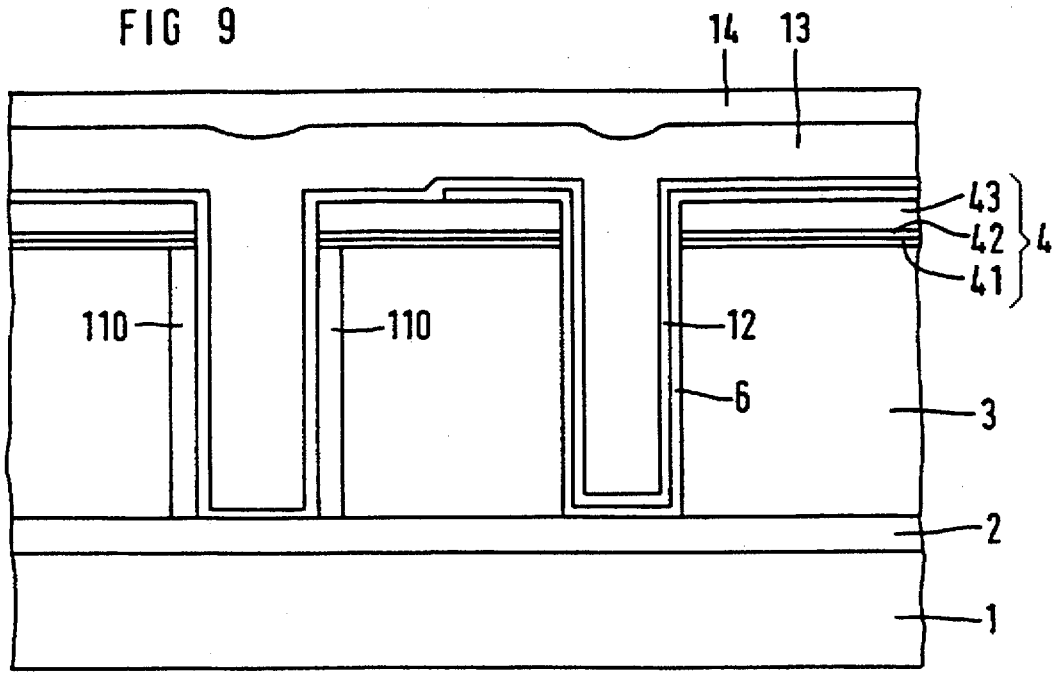
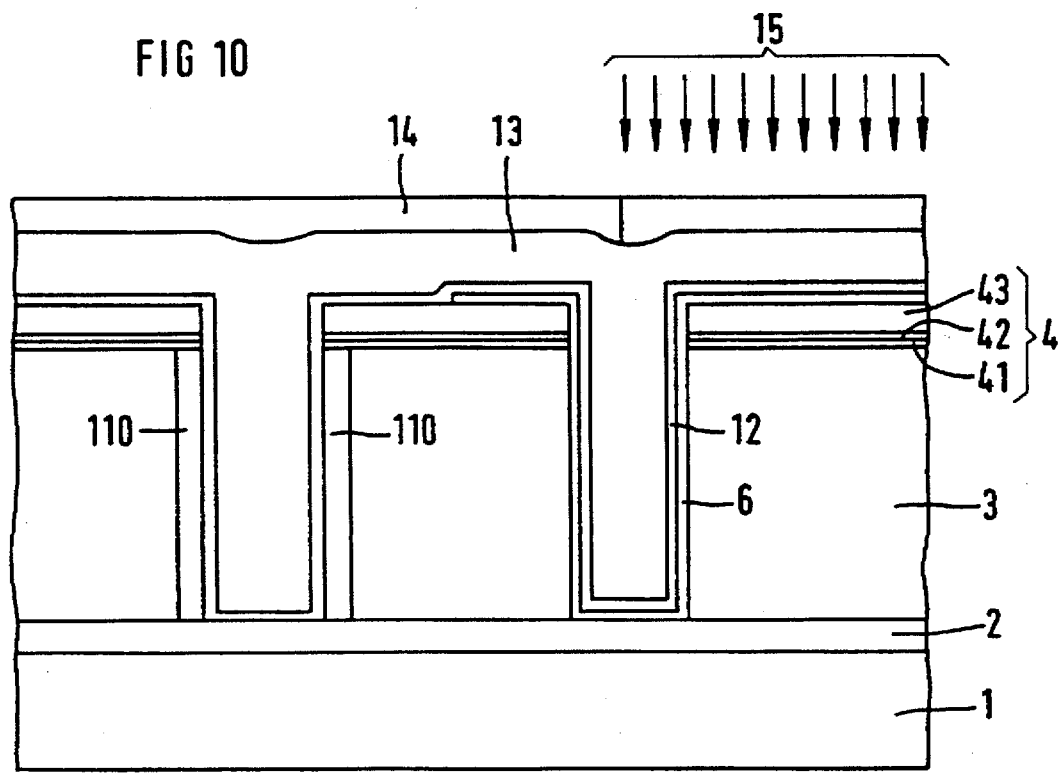

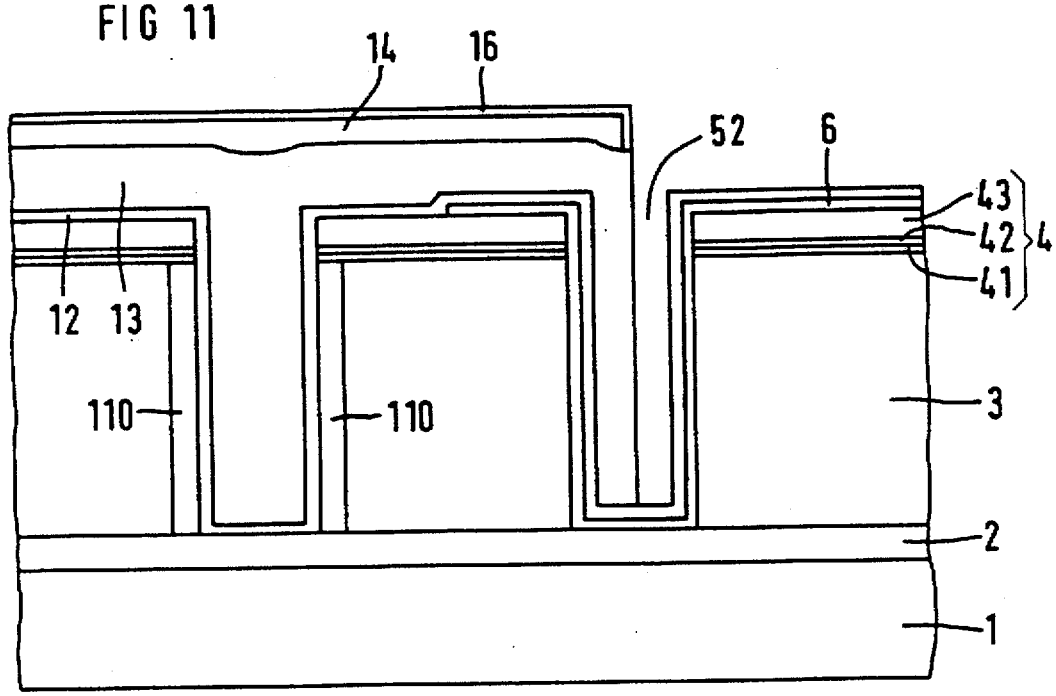
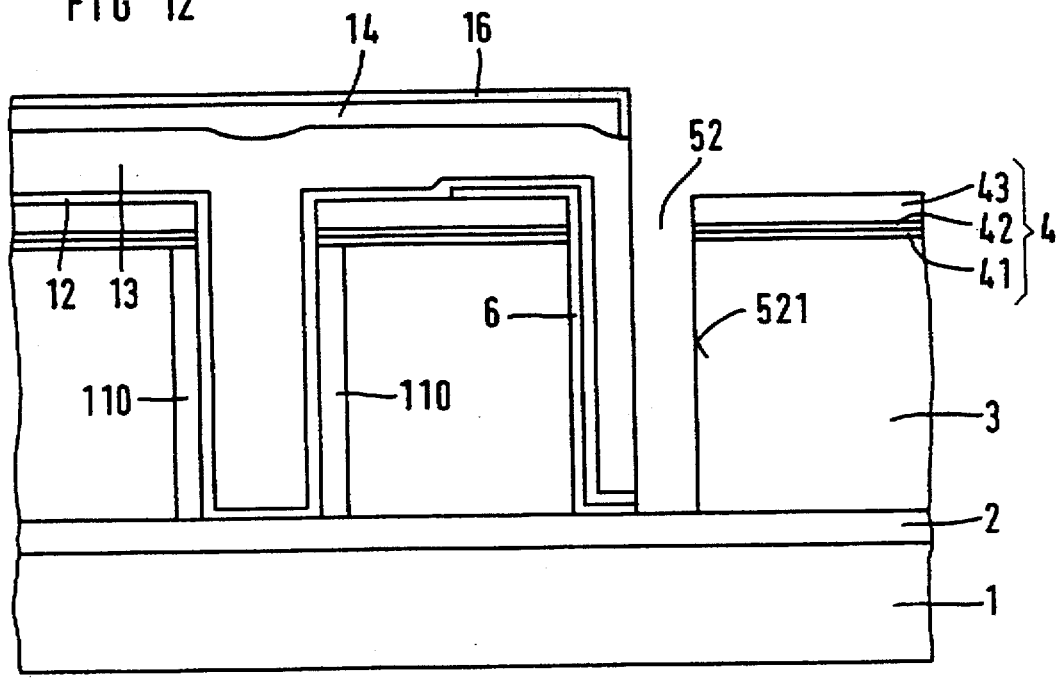

PROCESS FOR PRODUCING A DIFFUSION REGION ADJACENT TO A RECESS IN A SUBSTRATE

BACKGROUND OF THE INVENTION

For various applications it is necessary to produce recesses with a high aspect ratio (the aspect ratio is the ratio of the recess-depth to the recess width) and diffusion regions adjacent to the recesses in substrates. The intention is to produce diffusion regions of different conductivity types.

Recesses of this type, with adjacent diffusion regions, are required, for example, in smart power technology on SOI substrates. In smart power technology, complex logic components are monolithically integrated with high-voltage power components in a substrate. Since the logic components are operated with voltage levels of the order of 5 volts, whereas voltages of up to 500 volts occur in the case of high-voltage power components, electrical isolation of the high-voltage components from the logic components is necessary.

It is known (see, for example, A. Nakagawa et al., ISPSD pp97-101, Tokyo 1990, N. Yasuhara et al., IEDM 1991, pages 141-144) to electrically insulate the high- and low-voltage components completely from each other by dielectric insulation. To this end, the components are produced in an SOI substrate. An SOI substrate comprises, on a monocrystalline silicon wafer, an insulating $SiO_2$ layer and, on the insulating layer, a monocrystalline silicon layer which comprises the surface of the SOI substrate. The components are produced in the monocrystalline silicon layer. The insulating layer of the SOI substrate ensures vertical insulation, while the lateral insulation of the components is produced by recesses filled with insulating material. These recesses extend as far as the surface of the insulating layer. They fully surround the component to be insulated in the monocrystalline silicon layer. In order to fill the recesses, for example, the side wall is thermally oxidized and the remaining intermediate space is filled with polysilicon, etched back and subsequently surface-oxidized. The recess filling then consists of a polysilicon core which is fully enclosed by silicon oxide.

From N. Yasubara et al., IEDM 1991, pages 141-144, it is known that the switching performance of the components can be influenced by diffusion regions which are produced adjacent to an insulation recess in the monocrystalline silicon layer. This doping is carried out, for example, by diffusion out from doped glasses such as borosilicate glass or phosphorus silicate glass or by ion implantation.

Since recess depths of the order of 20 μm with aspect ratios of 5 to 10 occur in smart power technology, it is difficult, when doping the side walls of the insulation recesses, to use ion implantation to produce diffusion regions with a uniform predeterminable extent.

For this reason, in order to produce diffusion regions adjacent to insulation recesses, a doped layer is applied over the entire surface before the recess is filled. Diffusion regions adjacent to the recess are produced by diffusion out from this doped layer. The surface of the substrate is in this case protected, for example, by a recess mask used during the recess etching.

In the case of recess depths and aspect ratios such as occur in smart power technology, it is not possible to structure the doped layer using the conventional photoresist technique, since illumination cannot be carried out through the photoresist at a depth of 20 μm. Furthermore, further problems are caused during illumination as a result of the lack of focusing and light reflections in the resist. It is therefore not possible to produce structured diffusion regions with different conductivity type using the known technique. In order to produce circuits in which recesses with adjacent diffusion regions of different conductivity type are required, the diffusion regions of different conductivity type are produced in two steps. Firstly, those recesses in whose side walls diffusion regions of a first conductivity type are to be produced are etched. After the diffusion regions have been produced, the recesses are filled. Next, using a second recess mask, those recesses in whose side walls diffusion regions of a second conductivity type are to be produced are etched. After the second diffusion regions have been produced, these recesses are also filled. If it is furthermore required to produce recesses in whose side walls diffusion regions are not produced, then further recess etching with subsequent recess filling is necessary.

SUMMARY OF THE INVENTION

An object of the invention is therefore to provide a process for producing a diffusion region adjacent to a recess in a substrate, with which structured diffusion regions can be produced within a recess. The intention is for the process to be suitable, in particular, for producing diffusion regions of different conductivity type, which are arranged adjacent to the same recess or different recesses.

In the process according to the invention, a diffusion barrier layer is applied over the entire surface after a recess has been produced. The diffusion barrier layer is structured using a multi-layer photoresist system comprising at least two layers. A doped layer, which is suitable as a diffusion source, is deposited over the entire surface onto the structured diffusion barrier layer. A diffusion region is formed adjacent to the recess by diffusion out from the doped layer, the structured diffusion barrier layer under the doped layer acting as a mask. The diffusion barrier layer is configured in such a way that it prevents diffusion of the dopant out from the doped layer into the substrate. The diffusion barrier layer is preferably made from $SiO_2$ or $Si_3N_4$. Doped polysilicon or doped glass is, in particular, suitable as the doped layer.

In order to produce diffusion regions of different conductivity type, a first diffusion barrier layer which is structured using a multi-layer resist system comprising at least two layers is firstly applied. A first doped layer, which is used as the diffusion source for producing a first diffusion region, is deposited thereon. After the first diffusion region has been produced, the first doped layer is removed. A second diffusion barrier layer is applied over the entire surface. The second diffusion barrier layer and the underlying first diffusion barrier layer are structured using a multi-layer resist system comprising at least two layers. A second doped layer, which is used as the diffusion source for forming a second diffusion region, is then deposited over the entire surface. After the second doped layer, the second diffusion barrier layer and the first diffusion barrier layer have been removed, the further processing of the recess is carried out, for example by filling with $SiO_2$ and polysilicon.

In applications in which simultaneous structuring of the second diffusion barrier layer and the first diffusion barrier layer could lead to damage to the surface of the substrate as a result of the nonuniform thickness, the structured first diffusion barrier layer is removed before the second diffusion barrier layer is applied. In this case, only the second diffusion barrier layer is structured in the second structuring step.

In this way it is possible to produce different doped diffusion regions which are arranged in different recesses, which are arranged on different side walls of a recess, which are arranged next to one another on a side wall of a recess or alternatively those which overlap. With the process according to the invention, only one recess etching is required for producing diffusion regions of different conductivity type. After diffusion regions have been produced using a method according to the invention, the recesses can be filled and further processed in one step. This considerably reduces the process outlay.

For structuring the diffusion barrier layers, all multi-layer photoresist systems which lead to planarization of the structure and in which the photolithographic structuring in the top layer takes place at the surface, are suitable. Such resist systems are, for example, known from M. Sebald et al., SPIE Vol. 1262, pp. 528–537 (1990) or H. Ahne et al., Siemens Review, R&D Specials, pp. 23–27 (1991).

In order to structure the diffusion barrier layers, a bottom resist layer, which is made opaque by baking-out, is preferably applied. To this end, for example, a photoresist based on diazoquinone/Novolak is suitable. In the event of bubble formation in the bottom resist, a sufficient degree of planarization can be ensured by planarizing back-etching and repeated resist application. In order to fully avoid bubble formation in the bottom resist layer, it is advantageous to apply the photoresist at reduced pressure, optionally in a vacuum.

A top resist layer, which is illuminated and developed, is applied to the bottom resist layer. The bottom resist layer is etched in an anisotropic etching process, using the developed top resist layer as a mask. A silicon-containing terpolymer which is made of the monomers maleic anhydride, allyltrimethylsilane and maleimide, is preferably used for the top resist layer. In this case, the bottom resist layer is preferably structured in an $O_2$ plasma. In this case the top resist layer is protected from $O_2$ plasma attack as a result of reaction of the $O_2$ from the plasma with the silicon from the top resist layer, to form $SiO_2$. A further increased resistance of the top resist layer to $O_2$ plasma etching is achieved if the unilluminated part of the top resist layer is silylated by treatment with an aminosiloxane at the surface before the bottom resist layer is structured.

The invention is explained in more detail below with the aid of the figures and an illustrative embodiment.

BRIEF DESCRIPTION OF THE DRAWINGS

FIG. 3 shows the SOI substrate after the application of the bottom resist layer and the top resist layer.

FIG. 4 shows the illumination of the top resist layer.

FIG. 9 shows the SOI substrate after application of a second diffusion barrier layer, a bottom resist layer and a top resist layer.

FIG. 10 shows the illumination of the top resist layer.

FIG. 11 shows the SOI substrate after the structuring of the bottom resist layer.

FIG. 12 shows the SOI substrate after the structuring of the second diffusion barrier layer and the first diffusion barrier layer.

DETAILED DESCRIPTION OF THE PREFERRED EMBODIMENTS

Figure 1:
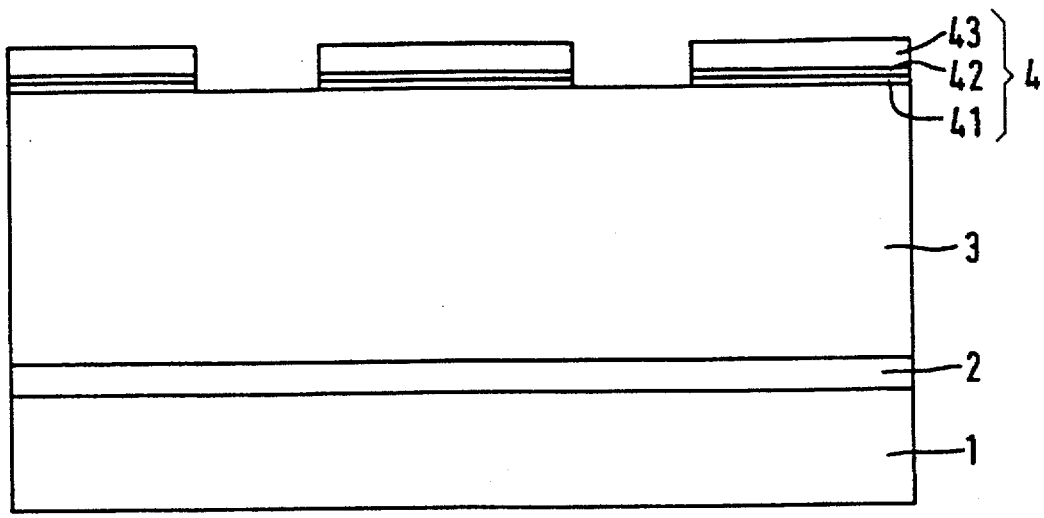
FIG. 1 shows an SOI substrate with a recess mask.

A recess mask 4 is applied to an SOI substrate which comprises a monocrystalline silicon wafer 1, an $SiO_2$ insulating layer 2 and a monocrystalline silicon layer 3 (see FIG. 1). The insulating layer 2 has a thickness of 2 µm. The monocrystalline silicon layer 3 has a thickness of 20 µm and is, for example, weakly n-doped.

The SOI substrate is preferably produced using the direct wafer bonding (DWB) or silicon direct bonding (SDB) process, which is, for example, disclosed by Yu Ohata et al., IEEE 1987, pages 443–446.

The recess mask 4 comprises a lower layer 41, a middle layer 42 and an upper layer 43. The lower layer 41 is produced, for example, by thermal oxidation to a thickness of 50 nm. The middle layer 42 is produced, for example, by CVD of $Si_3N_4$ to a thickness of 150 nm. The upper layer 43 is, for example, produced by CVD of $SiO_2$ to a thickness of 1600 nm. In order to structure the recess mask 4, a resist mask is applied to this layer structure. The recess mask 4 is structured using the resist mask in a $CH_3/O_2$ dry etching process. The recess mask 4 must be suitable for etching a deep recess.

Figure 2:
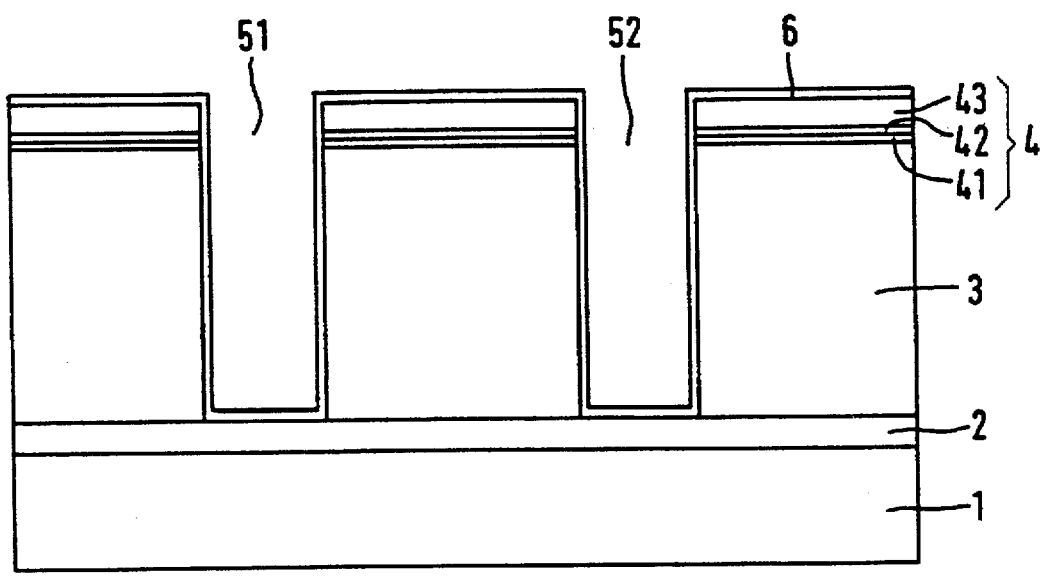
FIG. 2 shows the SOI substrate after the recess etching and after the deposition of a first diffusion barrier layer.

After the resist mask has been removed, for example by resist stripping, deep recesses 51, 52 are etched into the monocrystalline silicon layer 3 using the recess mask 4. To this end, an anisotropic dry etching process with $Cl_2/O_2$ chemistry is used. The recess etching is carried out selectively with respect to $SiO_2$ and therefore stops as soon as the surface of the insulating layer 2 is exposed (see FIG. 2). After the etching products have been removed, for example in an HF dip, a first diffusion barrier layer 6 is applied over the entire surface. The first diffusion barrier layer 6 is, for example, produced by CVD of $SiO_2$ or $Si_3N_4$ to a thickness of 50 nm.

In order to structure the first diffusion barrier layer 6, a bottom resist layer 7 is applied over the entire surface. The bottom resist layer 7 is, for example, applied from TMSR photoresist to a thickness of 2 µm. The bottom resist layer 7 is planarized and subsequently baked out, so that it becomes opaque. The effect of this is to reduce reflections (see FIG. 3). A top resist layer 8, which is further planarized, is applied to the bottom resist layer 7. A silicon-containing terpolymer which is made of the monomers maleic anhydride, allyltrimethylsilane and maleimide, is, for example, used as the top resist layer 8.

Figure 5:
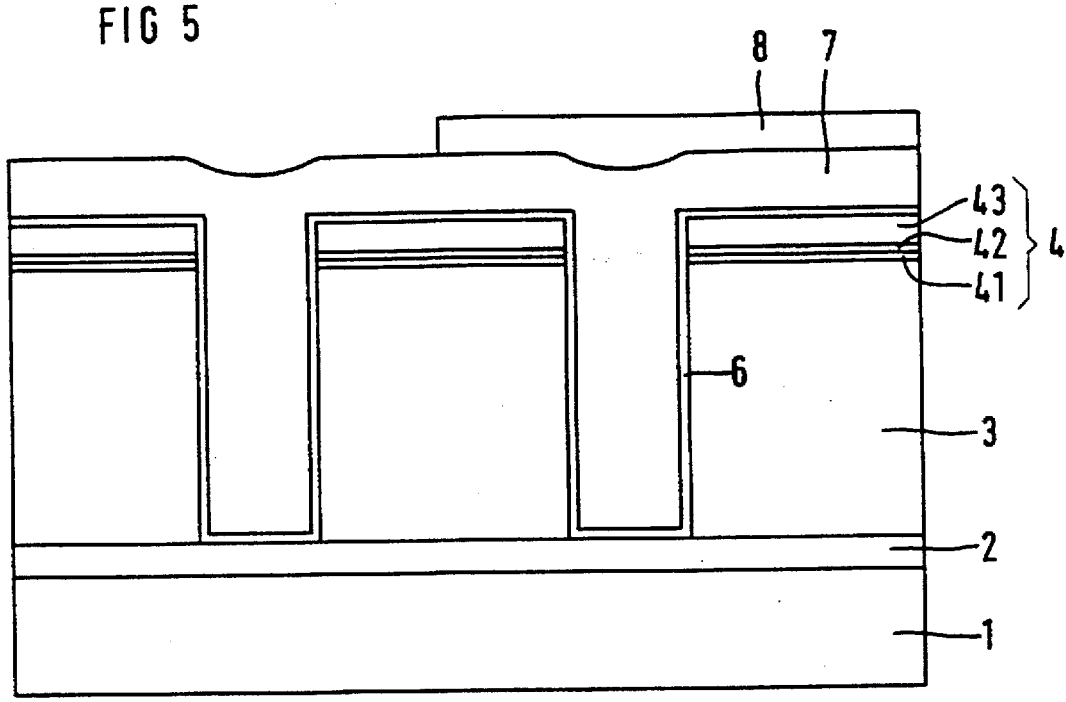
FIG. 5 shows the SOI substrate after development of the top resist layer.

The top resist layer 8 is illuminated with light, indicated in FIG. 4 as an arrow 9. By developing the illuminated part of the top resist layer 8, the surface of the bottom resist layer 7 is exposed in this region (see FIG. 5).

Figure 6:
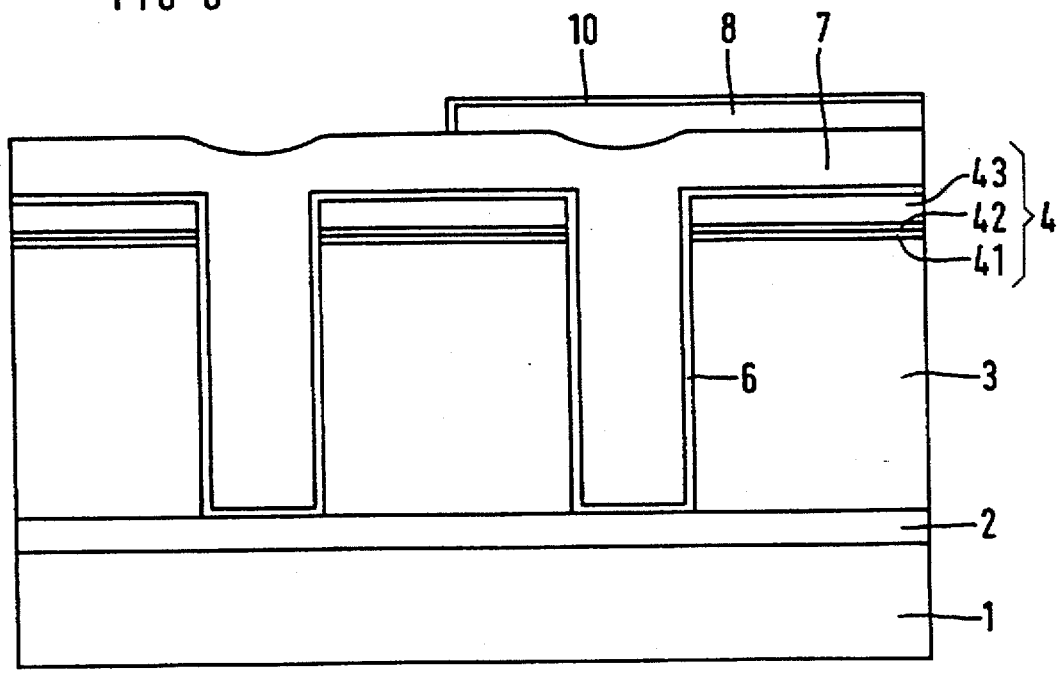
FIG. 6 shows the SOI substrate after silylation of the top resist layer.

The unilluminated part of the top resist layer 8 is silylated by the action of aminosiloxane at the surface. This forms, on the surface of the top resist layer 8, a protective layer 10 which increases the resistance to $O_2$ plasma etching (see FIG. 6).

Figure 7:
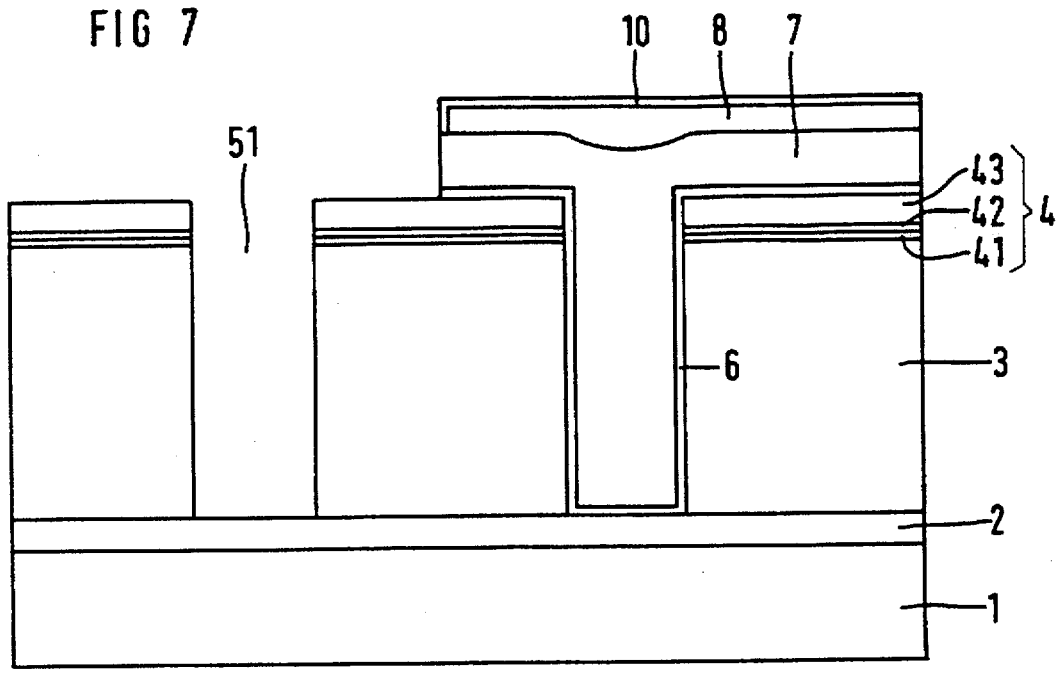
FIG. 7 shows the SOI substrate after structuring of the bottom resist layer and the first diffusion barrier layer.

The exposed part of the bottom resist layer 7 is then anisotropically etched in an $O_2$ plasma. The $O_2$ plasma etching is selective with respect to both $SiO_2$ and $Si_3N_4$, so that the etching stops at the first diffusion barrier layer 6. The first diffusion barrier layer 6 is then etched in an isotropic wet etching process, for example using an HF dip (see FIG. 7). This exposes both the surface of the recess mask 4 and the side walls of the first recess 51 and the bottom of the first recess 51.

Figure 8:
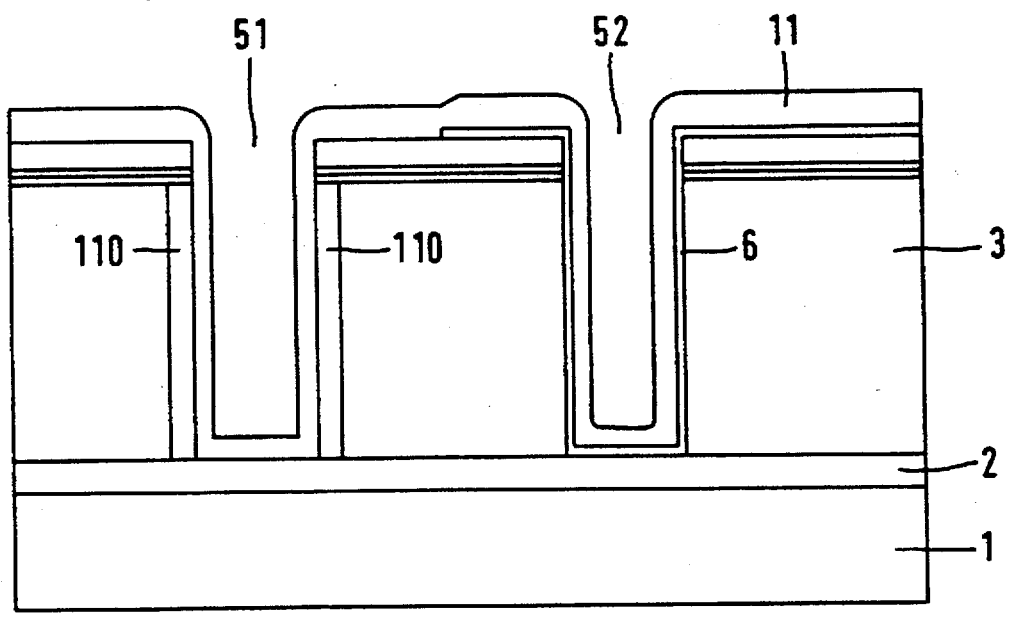
FIG. 8 shows the SOI substrate after application of a doped layer and the production of a first diffusion region.

The protective layer 10, the rest of the top resist layer 8 and the rest of the bottom resist layer 7 are removed. A doped layer 11 which is suitable as a diffusion source is then applied over the entire surface (see FIG. 8). The doped layer 11 is, for example, deposited from borosilicate glass. In the region of the first recess 51, the doped layer 11 lies directly on the surface of the monocrystalline silicon layer 3. In contrast, in the region of the second recess 52, the surface of the monocrystalline layer 3 is covered by the first diffusion barrier layer 6. In this region, the doped layer 11 lies on the first diffusion barrier layer 6. In a heat-treatment step at, for example, 1000° C. for 30 minutes in an $N_2$ atmosphere, first diffusion regions 110, which are adjacent to the first recess 51, are formed by dopant injection. In the region of the second recess 52, the first diffusion barrier layer 6 prevents the penetration of the dopant into the substrate.

After the heat-treatment step, the first doped layer 11 is removed.

A second diffusion barrier layer 12 is deposited over the entire surface, for example by CVD of $SiO_2$ or $Si_3N_4$ to a thickness of, for example, 50 nm. A further bottom resist layer 13 of, for example, TMSR photoresist, is applied thereto to a thickness of 2 μm and is planarized. The further bottom resist layer 13 is baked out so that it becomes opaque. A further top resist layer 14 is applied thereto and is planarized. The further top resist layer 14 is, for example, formed from CARL resist, a silicon-containing terpolymer which is made of the monomers maleic anhydride, allyltrimethylsilane and maleimide (see FIG. 9). The further top resist layer 14 is locally illuminated. The illumination is indicated in FIG. 10 as arrows 15. The illuminated part of the further top resist layer 14 is developed, the surface of the further bottom resist layer 13 being exposed in this region. In order to increase the resistance to $O_2$ plasma etching, the surface of the unilluminated part of the further top resist layer 14 is silylated with an aminosiloxane. This forms a further protective layer 16 on the surface of the further top resist layer 14. The exposed part of the further bottom resist layer 13 is anisotropically etched in an $O_2$ plasma (see FIG. 11).

Next, in an isotropic wet etching process, for example in an HF dip (in the case of an $SiO_2$ barrier), the second diffusion barrier layer 12 and the underlying portions of the first diffusion barrier layer 6 are etched. The isotropic wet etching takes place selectively with respect to silicon (see FIG. 12). As a result of the structuring of the second diffusion barrier layer 12 and the first diffusion barrier layer 6, a side wall 521 is exposed in the region of the second recess 52. The opposite side wall remains covered with the first diffusion barrier layer 6 and the second diffusion barrier layer 12. The side walls of the first recess 51 are covered with the second diffusion barrier layer.

In cases in which that part of the second diffusion barrier layer to be removed in the wet etching is partly arranged on the first diffusion barrier layer and partly arranged on the underlayer, and in which the thickness of the material to be etched is therefore nonuniform, the first diffusion barrier layer 6 may be removed before the second diffusion barrier layer 12 is applied over the entire surface, if there is a risk that the isotropic wet etching will cause damage to the underlayer as a result of excessive etching.

Figure 13:
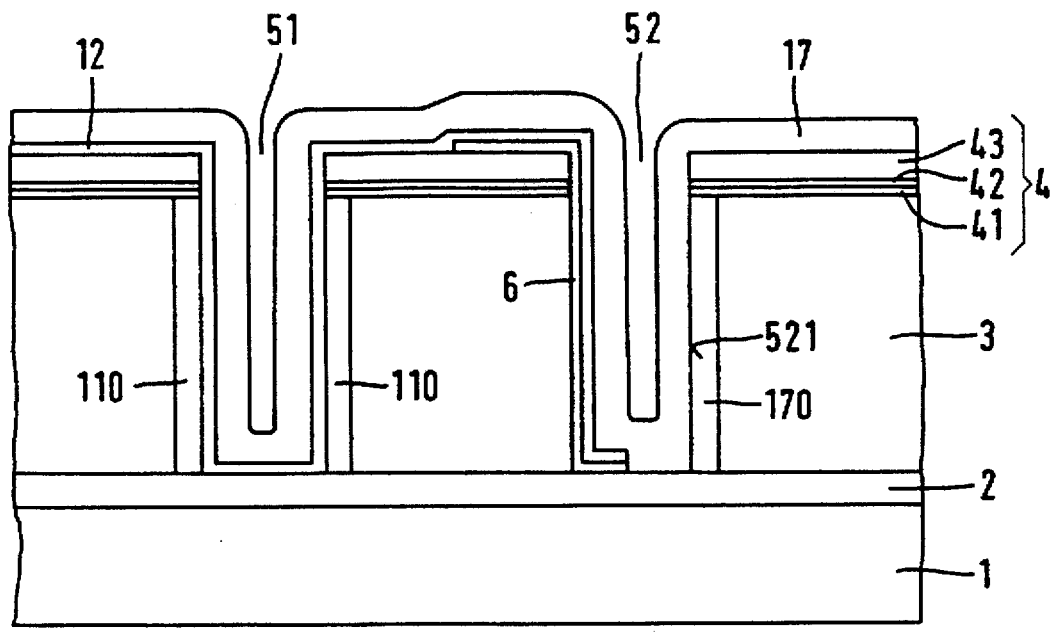
FIG. 13 shows the SOI substrate after deposition of a second doped layer and production of a second diffusion region.

After the further protective layer 16, the further top resist layer 14 and the further bottom resist layer 13 have been removed, a second doped layer 17, which is suitable as a diffusion source, is applied over the entire surface. The second doped layer 17 is, for example, formed by depositing phosphorus silicate glass (see FIG. 13). Only along the side wall 521 of the second recess 52 does the second doped layer 17 lie directly on the monocrystalline silicon layer 3. In the remaining region, the second diffusion barrier layer 12 or the first diffusion barrier layer 6 and the second diffusion barrier layer 12 is or are arranged between the second doped layer 17 and the monocrystalline silicon layer 3.

In a heat-treatment step at, for example, 1000° C. for 30 minutes in an $N_2$ atmosphere, a second doped region 170 is formed along the side wall 521 of the second recess 52 by injection of the dopant. The first diffusion barrier layer 6 and the second diffusion barrier layer 12 prevent the dopant from penetrating outside the side wall 521.

With the process according to the invention it is also possible, by corresponding structuring of the first and second diffusion barrier layers, to provide only parts of side walls of a recess with a diffusion region. It is further possible to produce adjacent or overlapping diffusion regions of different conductivity type in a side wall.

Figure 14:
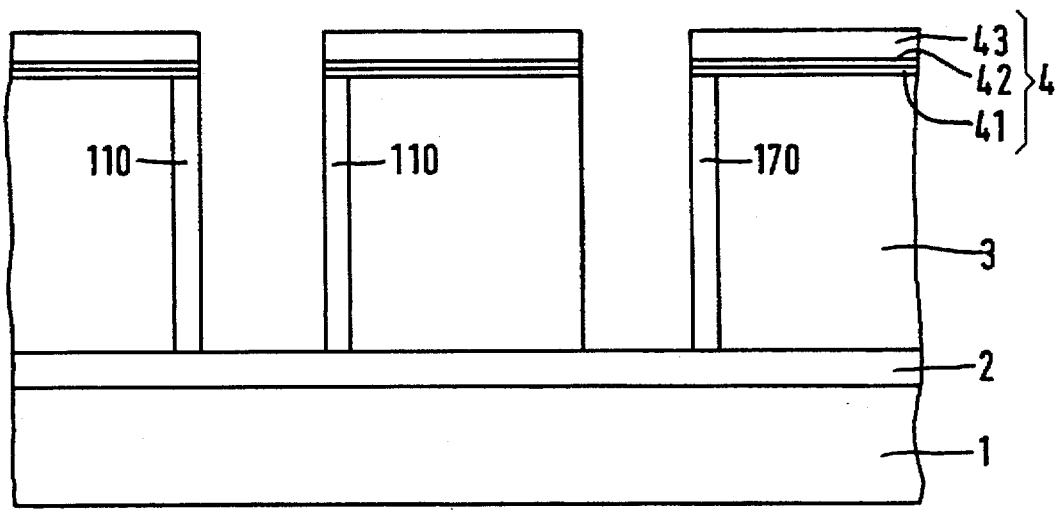
FIG. 14 shows the SOI substrate after removal of the second doped layer and the diffusion barrier layers.

The second doped layer 17, the second diffusion barrier layer 12 and the first diffusion barrier layer 6 are, for example, removed by wet chemical etching with HF dip, in the case of $SiO_2$ barriers, or $H_3PO_4$ in the case of $Si_3N_4$ barriers (see FIG. 14).

The recesses 51, 52 are then filled, for example by depositing $SiO_2$ and polysilicon. The components required for the circuit are then produced (not represented) in the monocrystalline layer 3. Components to be insulated are in each case fully encircled by a recess in the monocrystalline layer 3.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. A method for producing at least one diffusion region adjacent to a recess in a substrate, comprising the steps of:

etching at least one recess which extends essentially perpendicularly to a surface of the substrate into the substrate, the substrate having silicon at least on the surface;

applying a diffusion barrier layer over the entire surface;

structuring the diffusion barrier layer using a multi-layer photoresist system having at least two layers;

for structuring the diffusion barrier layer, applying a bottom resist layer which is made opaque by baking out;

applying a top resist layer which is illuminated and developed;

etching the bottom resist layer in an anisotropic dry etching process using the developed top resist layer as a mask;

removing the bottom resist layer and the top resist layer after the diffusion barrier layer has been structured;

depositing a doped layer which is suitable as a diffusion source over the entire surface; and forming the diffusion region by diffusion out from the doped layer, the structured diffusion barrier layer under the doped layer acting as a mask.

2. The method of claim 1, further comprising the steps of:

applying a first diffusion barrier layer over the entire surface;

structuring the first diffusion barrier layer using the multi-layer photoresist system having at least two layers;

depositing a first doped layer which is suitable as a diffusion source over the entire surface;

forming a first diffusion region by diffusion out from the first doped layer, the structured first diffusion barrier layer under the first doped layer acting as a mask;

removing the first doped layer after the first diffusion region has been formed;

applying a second diffusion barrier layer over the entire surface;

structuring the second diffusion barrier layer and the underlying first diffusion barrier layer using a multi-layer photoresist system having at least two layers;

depositing a second doped layer, which is doped with the opposite conductivity type to the first doped layer and is suitable as a diffusion source over the entire surface; and forming a second diffusion region by diffusion out from the second doped layer, the structured second diffusion barrier layer under the second doped layer acting as a mask.

3. The method of claim 2, further comprising the steps of:

removing the structured first diffusion barrier layer before the second diffusion barrier layer is applied; and structuring only the second diffusion barrier layer.

4. The method of claim 1, further comprising the steps of:

using a photoresist based on diazoquinone/Novolak for the bottom resist layer; and using a silicon-containing terpolymer, which is made of the monomers maleic anhydride, allyltrimethylsilane and maleimide, for the top resist layer.

5. The method of claim 1, further comprising the step of:

silylating the top resist layer with an aminosiloxane after development.

6. The method of claim 1, further comprising the step of:

structuring the bottom resist layer in an O2 plasma.

7. The method of claim 1, further comprising the step of:

providing the diffusion barrier layers containing at least one of the materials SiO2 or Si3N4.

8. The method of claim 1, further comprising the step of:

forming the doped layers from doped polycrystalline or amorphous silicon or from doped glass.

9. The method of claim 1, further comprising the steps of:

using an SOI substrate, with a monocrystalline silicon layer, an insulating layer arranged underneath and a monocrystalline silicon wafer arranged under the latter as the substrate;

extending the recess through the monocrystalline silicon layer as far as the insulating layer; and forming the diffusion regions in the monocrystalline layer.

* * * * *